United States Patent
Barre et al.

(10) Patent No.: US 6,791,165 B2
(45) Date of Patent: Sep. 14, 2004

(54) DEVICE FOR SHIELDING TRANSMISSION LINES FROM GROUND OR POWER SUPPLY

(75) Inventors: Philippe Barre, Le Fresne Camilly (FR); Gilbert Gloaguen, Tourvill sur Odon (FR)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/291,035

(22) Filed: Nov. 8, 2002

(65) Prior Publication Data

US 2003/0102536 A1 Jun. 5, 2003

(30) Foreign Application Priority Data

Nov. 13, 2001 (FR) .............................. 01 14664

(51) Int. Cl.[7] .............................. H01L 29/40
(52) U.S. Cl. ........................ 257/664; 257/662
(58) Field of Search .................. 257/738, 737, 257/723, 724, 728, 731, 662, 664; 361/760, 749, 782

(56) References Cited

U.S. PATENT DOCUMENTS

| | | | |
|---|---|---|---|
| 5,796,170 A | | 8/1998 | Marcantonio ............ 257/786 |
| 5,955,789 A | * | 9/1999 | Vendramin .............. 257/786 |
| 5,994,766 A | | 11/1999 | Shenoy et al. ............ 257/659 |
| 6,057,600 A | * | 5/2000 | Kitazawa et al. ........... 257/728 |
| 6,329,702 B1 | * | 12/2001 | Gresham et al. ............ 257/623 |
| 6,373,447 B1 | * | 4/2002 | Rostoker et al. ........... 343/895 |
| 6,555,907 B2 | * | 4/2003 | Katoh ....................... 257/728 |
| 6,563,299 B1 | * | 5/2003 | Van Horn et al. ........ 324/158.1 |
| 6,566,601 B2 | * | 5/2003 | Maetani .................... 174/52.4 |
| 2002/0113309 A1 | * | 8/2002 | Fazelpour .................. 257/728 |
| 2003/0042596 A1 | * | 3/2003 | Crane et al. ............... 257/690 |
| 2003/0043558 A1 | * | 3/2003 | Shirasaki ................... 361/767 |
| 2003/0111714 A1 | * | 6/2003 | Bates et al. ................ 257/678 |
| 2003/0198032 A1 | * | 10/2003 | Collander et al. .......... 361/760 |

\* cited by examiner

*Primary Examiner*—Eddie Lee
*Assistant Examiner*—Douglas W. Owens
(74) *Attorney, Agent, or Firm*—Aaron Waxler

(57) ABSTRACT

The invention relates to an integrated circuit provided with a set of contacts for connecting the integrated circuit to a differential transmission line. The set of contacts comprises at least one first pair of contacts intended to receive a first power supply voltage, a second pair of contacts intended to receive a second power supply voltage and a third pair of contacts, referred to as signal contacts, intended to be connected to the transmission lines. Each power supply contact may indifferently receive ground or one of the high or low power supply voltages, realizing two possible power supply configurations, positive or negative. The signal contacts are surrounded by the power supply contacts so as to realize a specific shielding which is independent of the positive or negative power supply configuration.

9 Claims, 2 Drawing Sheets

DEVICE FOR SHIELDING TRANSMISSION LINES FROM GROUND OR POWER SUPPLY

BACKGROUND OF THE INVENTION

1. Field of the Invention

The invention relates to the field of integrated circuits. The invention particularly relates to a device comprising an integrated circuit and a set of contacts for connecting said integrated circuit to at least one pair of transmission lines intended to convey electric signals to and/or from said integrated circuit, the set of contacts comprising at least a first pair of contacts intended to receive a first reference voltage, a second pair of contacts intended to receive a second reference voltage and a third pair of contacts, referred to as signal contacts, intended to be connected to said pair of transmission lines.

The invention finds numerous applications in the field of telecommunication, notably in optical transmission systems. It is particularly advantageous in high-rate applications.

2. Description of the Related Art

In the telecommunication applications using high-rate integrated circuits, it is often indispensable to use contacts realizing differential input/output access at a low voltage amplitude, for example, of the order of 0.2 V, notably of the CML (Common Mode Logic) type, LVDS (Low Voltage Differential Signaling) type, or other PECL (Positive Emitter Coupled Logic) types. These contacts are intended to be connected to differential transmission lines conveying differential signals materialized by tracks on a printed circuit board (PCB). The tracks should preferably be mutually protected from ambient electromagnetic perturbations, notably from interference or noise. Indeed, these perturbations are capable of considerably modifying the normal operation and performance of integrated circuits.

U.S. Pat. No. 6,215,184 describes a method of realizing a connection track for connecting integrated circuits on a printed circuit board by means of a set of connection points. The method neither describes nor suggests any specific means of shielding from noise and interference generated in the circuits. It neither suggests how these means should be made independent of the selected power supply configuration. In accordance with the considered application, the circuits may be fed in accordance with one of the possible power supply configurations, referred to as positive and negative. In accordance with the positive configuration, ground corresponds to the low voltage. In accordance with the negative configuration, ground corresponds to the high voltage. The shielding scheme imposes, in another respect and within the extent possible, to frame the signal by means of a "proper" reference, i.e. a non-parasitic reference, thus realizing an electromagnetic return path for the signal which is the least possible beset with noise. In general, this "proper" reference is connected to ground. In accordance with the power supply configuration of the application, positive or negative, the shielding scheme may thus have to be modified, which increases the costs of the circuits by possibly necessitating the provision of a set of contacts adapted to each power supply configuration.

SUMMARY OF THE INVENTION

It is an object of the invention to provide such a set of connections which comprises specific shielding means which are usable independently of the chosen power supply configuration.

To this end, an integrated circuit of the type described in the opening paragraph is characterized in that said signal contacts are surrounded by said first and second pairs of contacts.

These and other aspects of the invention are apparent from and will be elucidated, by way of non-limitative example, with reference to the embodiment(s) described hereinafter.

DETAILED DESCRIPTION OF THE INVENTION

In applications using integrated circuits operating at a high rate, such as optical transmissions, the transmitted signals are of the differential type. They are currently represented by complementary signals, referred to as components I and IQ of the differential signal when incoming signals are concerned and components O and OQ when outgoing signals are concerned. The examples illustrated in FIGS. 1 and 2 concern incoming signals, but the invention is also applicable at the output of the circuits for the connection sets supplying the outgoing signals. The two components I and IQ of the differential signal are simultaneously conveyed through two wires. The difference between the two signal components may be caused, for example, by a series of binary digital data of the "0" or "1" type.

Figure 1A:
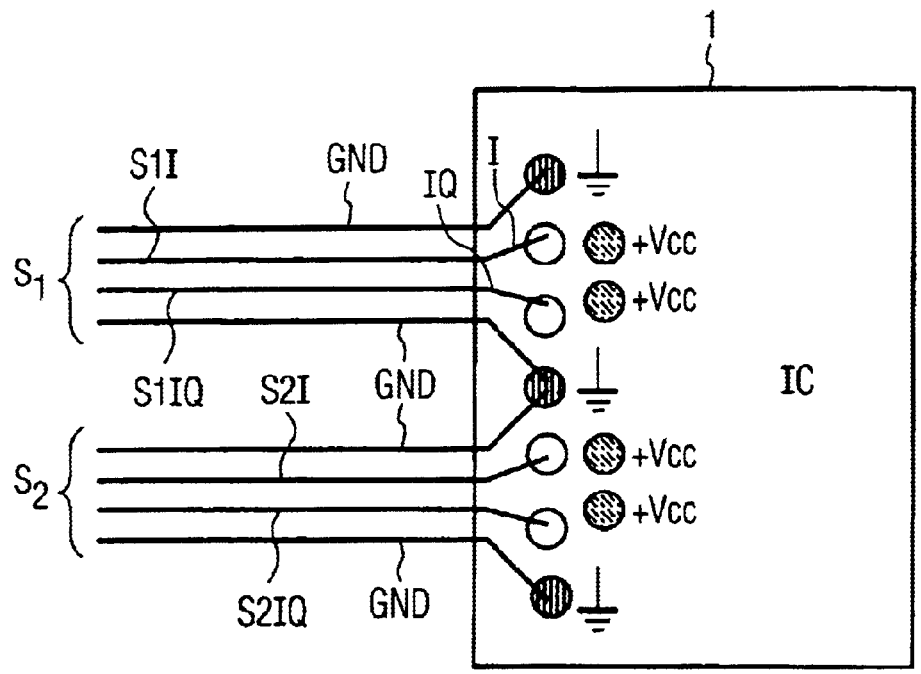
FIG. 1 is a diagram to illustrate an embodiment of a circuit according to the invention, in accordance with two configurations illustrated in FIGS. 1A and 1B.
Figure 1B:
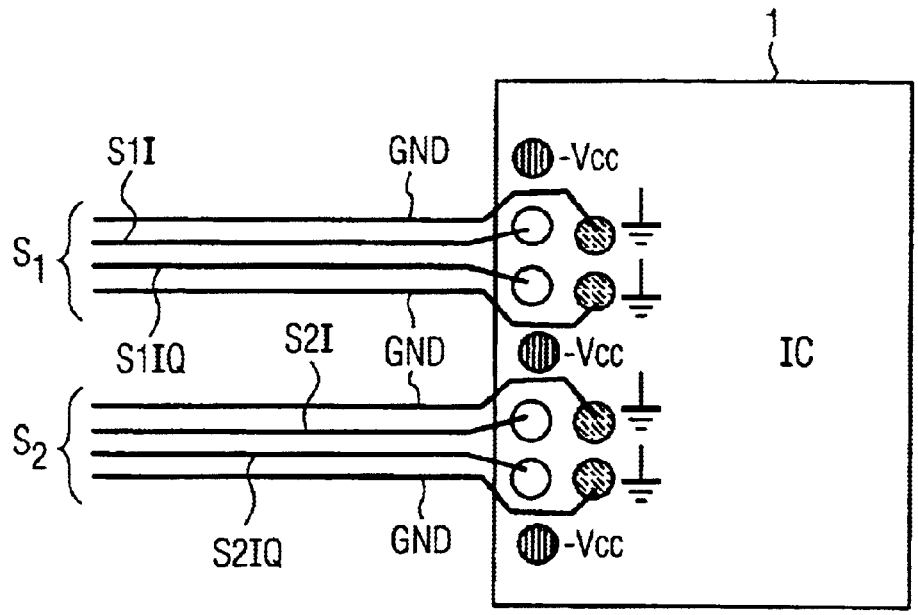

FIG. 1 shows a preferred embodiment of an integrated circuit according to the invention, denoted IC, connected to a first and a second parallel differential transmission line, denoted S1 and S2, respectively. The invention is identically applicable to a single transmission line. The presence of one of the two lines S1 and S2 and contacts in FIGS. 1A and 1B is intended to show how several lines can be connected by means of a device according to the invention. The first line S1 consists of a first component, denoted S1I and a second component, denoted S1IQ. The second line S2 consists of a first component, denoted S2I and a second component, denoted S2IQ. Each component I or IQ of the differential signal comprises, in its turn, two distinct paths comprising a first direct path or line conveying the useful signal to be transmitted, and a second return path or line suitable for a reference voltage, dependent on the application.

The differential lines convey the components I and IQ of the differential signals to be transmitted. They are made from a conducting material and drawn or printed on a support of an insulating material. The assembly of tracks forms a circuit, currently referred to as printed circuit board or PCB, intended to interconnect integrated circuits (a single integrated circuit is shown in FIG. 1) in accordance with a predetermined routing as a function of the envisaged application. The integrated circuits are generally situated within housings 1 made from an insulating material. The connections between the printed lines and the integrated circuits are realized by means of a set of contacts represented by means of circles in the Figure. In the case where the circuit is integrated in a housing of the BGA type (Ball Gate Array), the contacts are substantially spherical and are referred to as connection balls. The set of contacts comprises connections intended to receive the differential signals to be transmitted, referred to as signal contacts, and connections intended for power supply of the circuits, referred to as power supply contacts. The power supply is realized by means of two distinct power supply voltages, one being higher than the other and one generally corresponding to ground. The power supply contacts are thus subjected to one reference voltage from the two possible distinct reference voltages, one referred to as the high reference and the other referred to as the low reference. The power supply contacts are represented by shaded circles. Conventionally, in FIG. 1, the vertically shaded circles correspond to the contacts connected to the low reference and the obliquely shaded circles correspond to the contacts connected to the high reference.

Two power supply configurations are thus possible for the integrated circuit. In accordance with a first configuration, referred to as positive configuration, the low reference voltage corresponds to ground and the high reference voltage corresponds to a constant positive voltage, denoted +VCC. In accordance with the second configuration, referred to as negative configuration, the low reference voltage corresponds to a constant negative voltage, denoted −VCC and the high reference voltage corresponds to ground. The integrated circuits may thus be fed in accordance with the choice for one or the other of these configurations. In contrast, the envisaged application generally has only one reference voltage, for example, ground. In this case, it is preferable that the return lines of the differential lines are connected to ground. In accordance with the power supply configuration of the printed circuit board, ground is not connected to the same contacts, which implies that the routing of the printed tracks may be different from configuration to configuration, as is shown in FIGS. 1A and 1B.

FIG. 1A illustrates an embodiment of a circuit according to the invention in the positive configuration. FIG. 1B illustrates the same circuit in the negative configuration. The signal contacts, represented in FIGS. 1A and 1B by non-shaded circles are situated at the edge of the housing and are surrounded by the power supply contacts which receive constant reference voltages. The arrangement of the pairs of contacts is preferably symmetrical with respect to a plane which is perpendicular to the plane of the PCB and perpendicular to the side of the housing nearest the set of contacts under consideration. This arrangement of the contacts is compatible with the two possible power supply configurations. In each configuration, the direct transmission lines as well as the signal contacts to which they are connected are framed by ground or power supply, in accordance with the configuration used, thus constituting a shield of protection from possible electromagnetic perturbations generated by the signals transmitted at a high frequency.

The device illustrated in FIGS. 1A and 1B has numerous advantages. A first advantage is the facility of access of the signal contacts. The signal contacts are arranged at the edge of the housing so as to allow direct access to the transmission lines. A second advantage is the symmetry of the device. The contacts are arranged on the housing in a symmetrical manner with respect to a plane which is perpendicular to the plane of the integrated circuit and extends parallel to the transmission lines from a central point separating said transmission lines. This means that the distances covered by the signal may be the same for each complementary differential component SI and SIQ of the transmission line, with all the attendant well-known advantages. A third advantage is the quality of the shield. Each pair of transmission line is encircled as far as the signal contact by two proper reference lines which are not beset with noise, which is favorable for a good transmission of the signals.

FIG. 2 shows three other embodiments of the invention. These three embodiments are given by way of non-limiting example. They may lead to numerous variants without departing from the scope of the invention. The elements which are common with those in FIG. 1 are denoted by the same reference signs.

Figure 2A:
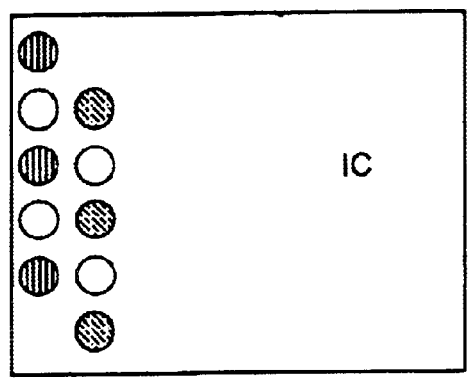
FIG. 2 is a diagram to illustrate three other embodiments of the invention, illustrated in FIGS. 2A, 2B and 2C, respectively.

FIG. 2A illustrates a variant in which the signal contacts are arranged in two parallel rows on the side in a staggered configuration so as to limit the occupied space. The power supply contacts are arranged around and between the signal contacts in the same parallel rows. In contrast, this embodiment is not symmetrical and the access to the signals is less direct than in the embodiment illustrated in FIG. 1.

Figure 2B:
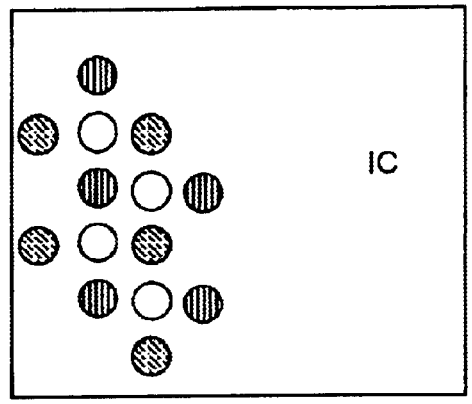

FIG. 2B illustrates another variant. In accordance with this variant, the signal contacts are always arranged in a staggered configuration in two parallel rows, but the power supply contacts are arranged in four parallel rows and particularly between the signal contacts on the two rows of signal contacts, such that each signal contact is surrounded at four sides by at least one power supply contact. This embodiment also allows a limitation of the space occupied by the contacts and thus a larger number of contacts on the housing. It also allows simple addition of other rows or layers of contacts towards the center of the housing. In contrast, this embodiment is not symmetrical.

Figure 2C:
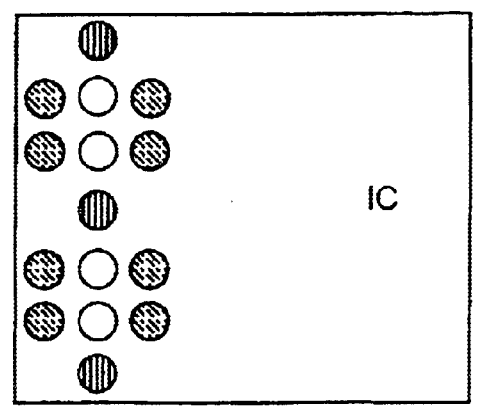

FIG. 2C illustrates yet another variant. In accordance with this variant, the signal contacts are arranged in successive pairs separated by at least one power supply contact on one and the same row parallel to the side of the housing. The other power supply contacts are arranged on both sides of the row of signal contacts, such that they surround each pair of signal contacts. This embodiment has the advantage that it is symmetrical and provides a good shielding of the transmission lines, but it takes up more space than the previously described embodiments.

An integrated circuit according to the invention, used in an application involving one pair of differential transmission lines has thus been described and illustrated by means of examples. Other variants may be envisaged as a function of the considered application without departing from the scope of the invention, particularly as regards the respective position and the number of contacts on the housing of the integrated circuit.

What is claimed is:

1. A device comprising an integrated circuit and a set of contacts for connecting said integrated circuit to at least one pair of transmission lines adapted to convey electric signals to and/or from said integrated circuit, the set of contacts comprising at least a first pair of contacts adapted to receive a first reference voltage, a second pair of contacts adapted to receive a second reference voltage at a different level from the first reference voltage so that one of said first and second reference voltages is designated as a ground reference, and a third pair of contacts, referred to as signal contacts, adapted to be connected to said pair of transmission lines, wherein each respective signal contact of said third pair of contacts is surrounded on two sides by at least one contact from said first pair of contacts and at least one contact from said second pair of contacts without any other contacts there between, so that each respective signal contact is directly adjacent both reference voltages of said first and second pairs of contacts.

2. A device as claimed in claim 1, wherein said pair of transmission lines comprises two wires for simultaneously transmitting differential electric signals (I, IQ) in parallel, each component being connected to a distinct signal contact.

3. A device as claimed in claim 2, wherein the first and second reference voltages correspond to power supply voltages of said integrated circuit, one power supply voltage of which, referred to as high voltage, is higher than the other, referred to as low voltage, a single power supply voltage corresponding to ground, thus realizing two distinct possibilities of power supply configurations, referred to as positive and negative configurations, according to whether ground corresponds to the high or low voltage, respectively.

4. A device as claimed in claim 3, wherein the pair of transmission lines further comprise a pair of return lines connected to the pair of contacts adapted to receive ground to convey electric signals 0 and 0Q output from the integrated circuit in the reverse direction of electric signals I and IQ.

5. A device as claimed in claim 1, wherein the pairs of contacts are symmetrically arranged with respect to a plane which is perpendicular to the plane of the integrated circuit and extend parallel to the transmission lines from a central point separating said transmission lines.

6. A device as claimed in claim 1, wherein the integrated circuit is integrated in a housing, characterized in that the signal contacts are arranged at the edge of the housing so as to be immediately accessible to the transmission lines.

7. A device as claimed in claim 6, wherein the housing is of the BGA (Ball Gate Array) type.

8. A printed circuit board comprising a support of an insulating material for supporting a device as claimed in claim 1, wherein the pair of transmission lines further comprise a pair of return lines adapted to convey electric signals away from the integrated circuit, wherein the pair of contacts designated as ground are adapted for connection to said pair of return lines, and wherein the transmission lines and the return lines are printed on said circuit.

9. A telecommunication apparatus comprising an integrated circuit and a set of contacts adapted for connecting at least one pair of transmission lines to the contacts to convey electric signals to and/or from an integrated circuit, the set of contacts comprising at least a first pair of contacts adapted to receive a first reference voltage, a second pair of contacts adapted to receive a second reference voltage and a third pair of contacts, referred to as signal contacts, adapted to be connected to said pair of transmission lines, wherein said signal contacts are surrounded on two sides by at least one contact from said first pair of contacts and at least one contact from said second pair of contacts without any other contacts there between, so that each respective signal contact is directly adjacent both reference voltages of said first and second pairs of contacts.

* * * * *